(12) United States Patent
Liu et al.

(10) Patent No.: US 9,899,575 B2
(45) Date of Patent: Feb. 20, 2018

(54) METHOD OF CONTINUOUS FLOW SYNTHESIS AND METHOD OF CORRECTING EMISSION SPECTRUM OF LIGHT EMITTING DEVICE

(71) Applicant: Nano and Advanced Materials Institute Limited, Hong Kong (HK)

(72) Inventors: Chenmin Liu, Hong Kong (HK); Chi Ho Kwok, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 2 days.

(21) Appl. No.: 15/140,501

(22) Filed: Apr. 28, 2016

(65) Prior Publication Data

US 2016/0322541 A1 Nov. 3, 2016

Related U.S. Application Data

(60) Provisional application No. 62/179,186, filed on Apr. 30, 2015.

(51) Int. Cl.
*H01L 21/00* (2006.01)
*H01L 33/50* (2010.01)
(Continued)

(52) U.S. Cl.
CPC ............ *H01L 33/502* (2013.01); *C09K 11/02* (2013.01); *C09K 11/883* (2013.01); *H01L 33/508* (2013.01); *H01L 2933/0041* (2013.01)

(58) Field of Classification Search
None
See application file for complete search history.

(56) References Cited

U.S. PATENT DOCUMENTS

| 2010/0163798 A1* | 7/2010 | Ryowa | C09K 11/02 252/301.4 R |
| 2010/0215852 A1* | 8/2010 | Rowe | B01J 13/04 427/213.3 |
| 2014/0326921 A1* | 11/2014 | Lu | B82Y 30/00 252/301.6 S |

FOREIGN PATENT DOCUMENTS

| CN | 102690520 A | 9/2012 |
| CN | 103597622 A | 2/2014 |
| KR | 101336251 B1 | 12/2013 |

OTHER PUBLICATIONS

Schlecht et al. "Toward Linear Arrays of Quantum Dots via Polymer Nanofibers and Nanorods". Chem. Mater. 2005, 17, pp. 809-814.*
(Continued)

*Primary Examiner* — Reema Patel (57) ABSTRACT

The present application provides a method of continuous flow synthesis of core/shell quantum dots doped polymer mats (QD-MAT), including mixing a first core precursor with a second core precursor and feeding the reaction mixture into a first furnace to obtain quantum dot cores; feeding a first shell precursor and a second shell precursor into a second furnace and simultaneously injecting the quantum dot cores to obtain core/shell quantum dots; mixing the core/shell quantum dots with a polymer solution to obtain a QD-polymer composite; and introducing the QD-polymer composite to an electrospinning system to fabricate the core/shell quantum dots doped polymer mats. The present application also provides a method of correcting emission spectrum of light emitting devices with the core/shell quantum dots doped polymer mats with light diffusing properties which can be used to replace the diffuser layer of light emitting devices.

19 Claims, 7 Drawing Sheets
(7 of 7 Drawing Sheet(s) Filed in Color)

(51) Int. Cl.
    *C09K 11/88*    (2006.01)
    *C09K 11/02*    (2006.01)

(56) References Cited

OTHER PUBLICATIONS

S Nizamoglu et al., White light generation using CdSe/ZnS core—shell nanocrystals hybridized with InGaN/GaN light emitting diodes, Institute of Physics Publishing, Jan. 10, 2007.
Ming-Lung Tu et al., Hybrid light-emitting diodes from anthracene-contained polymer and CdSe/ZnS core/shell quantum dots, Nanoscale Research Letters, 2014.
Xiaomeng Sui et al., Photoluminescence of polyethylene oxide-ZnO composite electrospun fibers, Polymer communication, 2007, pp. 1459-1463, vol. 48, Issue 6.

* cited by examiner

(Prior art)

METHOD OF CONTINUOUS FLOW SYNTHESIS AND METHOD OF CORRECTING EMISSION SPECTRUM OF LIGHT EMITTING DEVICE

CROSS-REFERENCE TO RELATED APPLICATION

This application claims the benefit of U.S. Provisional Patent Application No. 62/179,186 filed on Apr. 30, 2015, the entire content of which is hereby incorporated by reference.

FIELD OF THE PATENT APPLICATION

The present application relates to a method of synthesizing core/shell quantum dots, and more specifically to a method of synthesizing core/shell quantum dots doped polymer mats and a method of correcting emission spectrum of light emitting devices with the core/shell quantum dots doped polymer mats.

BACKGROUND

Quantum dots (QDs) are a unique class of semiconductors because they are small, ranging from 1-10 nm (10-50 atoms) in diameter. At these small sizes, materials behave differently from bulk semiconducting materials, giving quantum dots unprecedented tenability and enabling never before seen applications to science and technology. As compared with bulk semi-conducting materials, quantum dots show a more tunable range of emission energies. With their high luminescence quantum efficiency and acceptable lifetime, QDs can be classified as a promising material for display application.

The concepts of energy levels, band gap, conduction band and valence band still apply in quantum dots. However, they are different from bulk materials.

i. Quantum Dots' Electron Energy Levels are Discrete Rather than Continuous.

The addition or subtraction of just a few atoms to the quantum dot has the effect of altering the boundaries of the band gap. Changing the geometry of the surface of the quantum dot also changes the band gap energy, owing again to the small size of the dot, and the effects of quantum confinement.

ii. Quantum Dot Materials Show Tunable Band Gap.

Figure 1A:
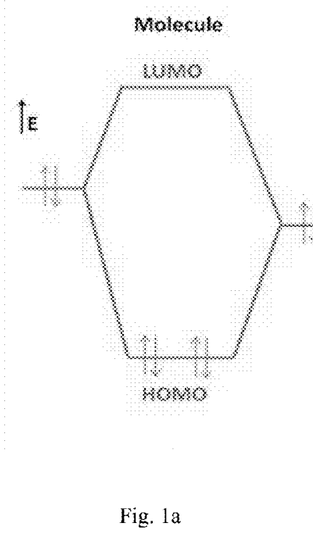
FIGS. 1a-1c respectively show the electronic energy state of a semiconductor of discrete molecules, nano-sized quantum dots and bulk semiconductors.
Figure 1B:
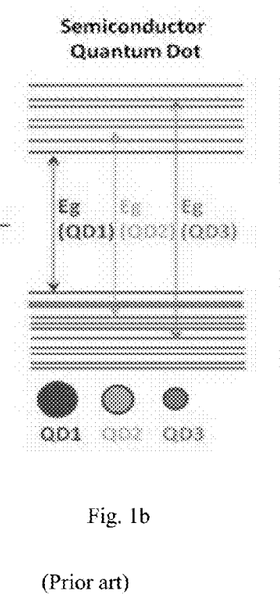
Figure 1C:
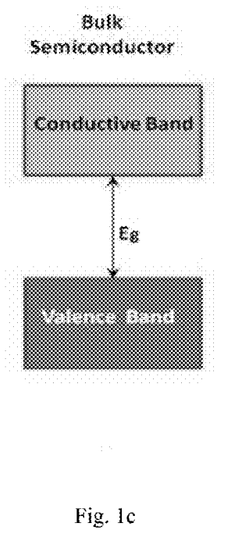

The fixed energy gap of bulk semiconductor and the controllable energy gap of quantum dots are displayed in FIGS. 1a-1c. It can be seen that with the decrease of quantum dot size from QD1 to QD3, the band gap can be tuned from Eg(QD1) to Eg(QD3), and the color of the quantum dots can be relatively tuned from red to blue (FIG. 1b). As with bulk semiconductor materials, electrons tend to make transitions near the edges of the band gap (FIG. 1c). It is therefore possible to control the output wavelength of a dot with extreme precision. In effect, it is possible for us to tune the band gap of a dot, and therefore specify its "color" output depending on our needs.

iii. Quantum Dot Display with Good Color Saturation

Quantum dots, suspended in liquid, absorb certain light and then reemit it in a specific color that depends on the particle's size. Each quantum dot is about one ten-millionth of an inch in diameter and is composed of a few hundred atoms of material and the colors of light they produce are much more saturated and controllable than that of other source, which is very meaningful for lighting.

iv. Quantum Dot Materials Show Free of Light Scattering.

With quantum dot technique, a tailored-spectrum white light is available. What is more, the small size of the quantum dots, which is much smaller than the wavelength of visible light, can eliminates all light scattering and the associated optical losses. In contrast, optical backscattering losses using larger conventional phosphors reduce the package efficiency by as much as 50 percent.

In the recent decades, QD-LED products are available in the market. However, one of the most serious obstacles for using QD-LEDs in consumer products is the toxicity of Cd- and Pb-based QDs. Core-shell type QDs have been developed to address this issue. However, the sealing technology and how to lower down the production cost remain big challenges for the existing QD-LEDs.

Figure 2A:
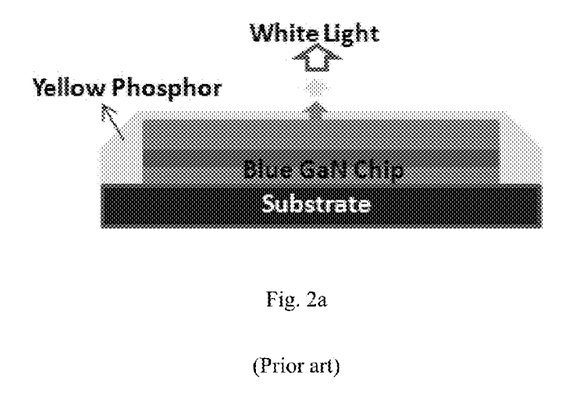
FIG. 2a is a schematic picture of the composition of one phosphor-based down conversion white LED device.
Figure 2B:
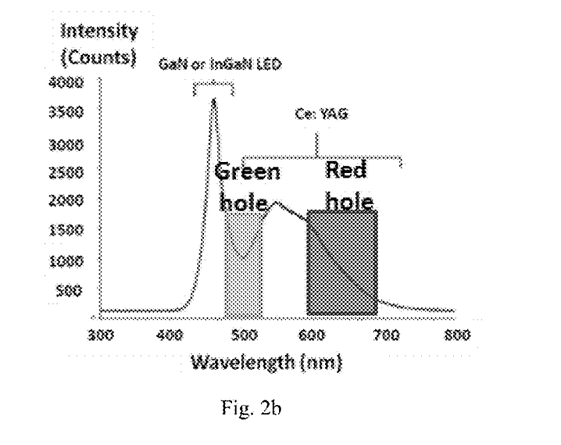
FIG. 2b is a spectrum of a "white" LED clearly showing blue light which directly emitted by a GaN-based LED and the more broadband light emitted by the Ce:YAG phosphor.

Furthermore, commercially available white LEDs emit a harsh and bluish cold white light, with poor color rendering properties, which limit their wide-scale use in indoor illumination applications. The poor quality of the white light perceived originates in the yellow converter material, Ce:YAG, due to its lack of emission in the green and red parts of the spectrum as shown in FIGS. 2a and 2b. The broadband light emitted by the Ce:YAG phosphor are roughly 500-700 nm. Correction of emission of conventional phosphors is needed.

In short, there remains a need to develop a cost effective and green approach for large scale synthesis of non-toxic luminescent quantum dots with precisely controlled luminophore and to improve emission of phosphors.

SUMMARY

The present application provides a method of continuous flow synthesis of core/shell quantum dots doped polymer mats (QD-MAT), including:

mixing a first core precursor with a second core precursor and feeding the reaction mixture into a first furnace to obtain quantum dot cores;

feeding a first shell precursor and a second shell precursor into a second furnace and simultaneously injecting the quantum dot cores to obtain core/shell quantum dots;

mixing the core/shell quantum dots with a polymer solution to obtain a QD-polymer composite; and introducing the QD-polymer composite to an electrospinning system to obtain quantum dot nanofibers (QD-nanofibers) and thereby fabricating the core/shell quantum dots doped polymer mats.

The temperature of the first furnace may be maintained with a temperature deviation no more than about 3° C.

The core/shell quantum dots may have a double layer or triple layer core/shell structure. The core and shell precursors may include at least one element selected from the group consisting of In, P, Zn, S, Se, N, Ga, Si, Ti, Ce, La, V, O and Cd. The core/shell quantum dots may have a core/shell structure selected from the group consisting of InP/ZnS, InP/ZnSe, InN/GaN, InP/ZnS/SiO$_2$, InP/ZnS/InZnS, GaP/ZnS/SiO$_2$, GaP/ZnS/GaZnS, InN/GaN/SiO$_2$ and CdSe/ZnS. The size distribution of the core/shell quantum dots may have a standard deviation of about 10% or less.

The method of continuous flow synthesis of QD-MAT may further include forming an additional coating around the core/shell QDs. The additional coating may include a compound having an affinity for the polymer solution and may include at least one selected from the group consisting of silicon dioxide, zirconium oxide, titanium dioxide and other inorganic oxides having an affinity for the polymer solution. The additional coating may be formed by micro emulsion synthesis.

The core/shell QDs may be dispersed in a polymer solution at about 25-50° C. to obtain a QD-polymer composite with a concentration of about 0.1-5 wt % of QDs, preferably about 0.1-2 wt %, and more preferably about 0.1-1 wt %. The polymer solution may include at least one polymer selected from the group consisting of nylon 6.6, polyurethanes (PU), polybenzimidazole (PBI), polycarbonate (PC), polyacrylonitrile (PAN), polymethacrylate (PMMA), polyaniline (PANI), polystyrene (PS), polyethylene terephthalate (PET), poly(vinylidene fluoride) (PVDF), polyvinyl fluoride (PVF), polyvinylchloride (PVC), poly(9-vinylcarbazole) (PVK) and polyvinylacetate (PVAc). The QD-polymer composite may contain at least one solvent selected from the group consisting of toluene, N,N-dimethylformamide, acetone, chloroform and dichloromethane. The electrospun QD-nanofibers may have a diameter ranging from about 0.1 μm to about 5 μm.

The method may be carried out in a flow reactor with a flow rate in the range of about 2.9 ml/min to 15 ml/min.

In another aspect, the present application provides a method of correcting emission spectrum of a light emitting device, including laminating at least one layer of the QD-MATs prepared from the above method on the light emitting device. For an LED display, the QD-MATs may be directly laminated on either of a diffuser or a brightness enhancement film. For an LED lighting, the QD-MATs may be laminated on the surface of the encapsulant as a remote phosphor. The QD-MATs may include QDs with same or different sizes. The QD-MATs may be doped with high quantum yield InP/ZnS/SiO$_2$ or InP/ZnS/TiO$_2$ core/shell QDs and Cu (Mn) doped ZnSe/SiO$_2$ core/shell QDs of different sizes.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The embodiments of the present application are described with reference to the attached figures, wherein.

DETAILED DESCRIPTION

Reference will now be made in detail to preferred embodiments of methods of continuous flow synthesis of core/shell quantum dots doped polymer mats and methods of correcting emission spectrum of light emitting devices using the core/shell quantum dots doped polymer mats disclosed in the present application, examples of which are also provided in the following description. Exemplary embodiments of the methods disclosed in the present application are described in detail, although it will be apparent to those skilled in the relevant art that some features that are not particularly important to an understanding of the present application may not be shown for the sake of clarity.

Before the present application is described in further detail, it is to be understood that the terminology used herein is for the purpose of describing particular embodiments only, and is not intended to be limiting, since the scope of the present application will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the application. The upper and lower limits of these smaller ranges may independently be included in the smaller ranges is also encompassed within the application, subject to any specifically excluded limit in the stated range. Where the stated range includes one or both of the limits, ranges excluding either or both of those included limits are also included in the application.

Unless defined otherwise, all technical and scientific terms used herein have the same meaning as commonly understood by one of ordinary skill in the art to which this application belongs. Although any methods and materials similar or equivalent to those described herein can also be used in the practice or testing of the present application, a limited number of the exemplary methods and materials are described herein.

It must be noted that as used herein and in the appended claims, the singular forms "a", "an", and "the" include plural referents unless the context clearly dictates otherwise.

Figure 3:
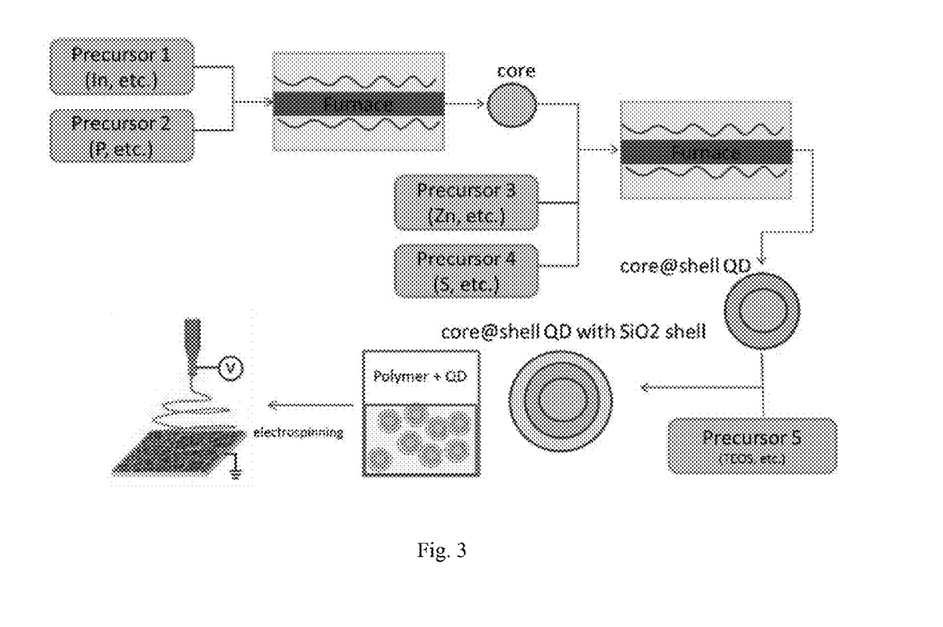
FIG. 3 shows a synthetic scheme of the method of fabricating non-toxic core/shell QDs in polymer matrix through a continuous flow synthesis according to the present application.

In one aspect, the present application provides a method of continuous flow synthesis of core/shell quantum dots doped polymer mats (QD-MAT). As shown in FIG. 3, the method includes:

1. mixing a first core precursor (Precursor 1) with a second core precursor (Precursor 2) and feeding the reaction mixture into a first furnace to obtain quantum dot cores;
2. feeding a first shell precursor (Precursor 3) and a second shell precursor (Precursor 4) into a second furnace and simultaneously injecting the quantum dot cores to obtain core/shell quantum dots;
3. mixing the core/shell quantum dots with a polymer solution to obtain a QD-polymer composite; and
4. introducing the QD-polymer composite to an electrospinning system to fabricate the core/shell quantum dots doped polymer mats.

The first and second core precursors may include at least one element selected from the group consisting of In, P, Zn, S, Se, N, Ga, Si, Ti, Ce, La, V, O and Cd. In some embodiments, the core precursors may include cadmium oxide and selenium. The core precursors may be pumped into a first batch reactor and then fed into the first furnace through a large-diameter steel tube to synthesize quantum dot cores. The reactor and furnace may operate under nitrogen gas. The mixing ratio of the first to second core precursors, temperatures of the batch reactor and the first furnace, and stirring speed may vary according to the chemicals used for the first and second core precursors.

The first and second shell precursors may include at least one material selected from the group consisting of In, P, Zn, S, Se, N, Ga, Si, Ti, Ce, La, V, O and Cd. In some embodiments, the shell precursors may include zinc oxide and sulphur. The mixing ratio of the first to second shell precursors depends on the chemicals used for the first and second shell precursors. In some embodiments, the first and second shell precursors may be mixed in 1:1 ratio.

The mixed shell precursors may be injected into a second furnace simultaneously with the QD cores to synthesize core/shell QDs. In some embodiments, the temperature of the second furnace ranges around 100-200° C. In some embodiments, the furnace may have a heating profile of 100° C. to 150° C. to 180° C. within 2 minutes. The second furnace may operate under nitrogen gas.

The core/shell QDs may have a double layer or triple layer core/shell structure. Examples of core/shell QDs suitable to be synthesized by the method of the present application may include but not limited to InP/ZnS, InP/ZnSe, InN/GaN, InP/ZnS/SiO$_2$, InP/ZnS/InZnS, GaP/ZnS/SiO$_2$, GaP/ZnS/GaZnS, InN/GaN/SiO$_2$ and CdSe/ZnS.

The size uniformity of the QDs is mainly controlled by reaction temperature and stirring condition in the furnaces while the size of the QD is mainly controlled by the time of reaction. With a better control of reaction temperature (i.e. temperature deviation no more than 3° C.), the size uniformity of the QDs increases. Under a constant reaction temperature, the longer the reaction time, the more time is allowed for the crystal to grow up. By keeping the temperature of the furnaces constant, the reaction time can be adjusted to get the target size of QDs. In some embodiments of the present application, the size distribution of QDs may have a standard deviation of about 10%. In some particular embodiments, the QDs may have a size of 2±0.2 nm. In some other embodiments, the QDs may have a size of 5±0.5 nm.

An additional coating may be formed around the above core/shell QDs. In typical syntheses of quantum dots, surface bound ligands are added. These surface ligands hamper polymerization and/or reduce the mechanical stability of the converter/polymer composite thus will seriously affect the reliability of the final products. In particular, ligands with long carbon chain may act as polymer softeners, and further reduce the compatibility with polar polymers, such as silicones. The additional layer of shell coating according to the present application can avoid the use of surface bound ligands and provide excellent compatibility between the shell and the polar polymers.

Furthermore, the additional coating can passivate defects on the surface of the QDs thus providing higher quantum efficiency and higher luminescence, which is very meaningful to achieve a higher efficacy of the whole QD-LED. It was found that encapsulating the QDs with inorganic shells can enhance the thermal stability of the whole encapsulant, thus will further improve the stability and reliability of the QD-LED device.

Suitable additional coating may include those having an affinity for the polymer solution. Examples of suitable additional coating may include at least one selected from the group consisting of silicon dioxide, zirconium oxide, titanium dioxide and other inorganic oxide. In some embodiments, the layers of additional coating may have a thickness of about 10-20 nm. Preferably, the additional coating may include silicon dioxide. In some embodiments, the precursor of the additional coating (Precursor 5 in FIG. 3) may include tetraethyl orthosilicate (TEOS) and/or tetramethoxylsilane (TMOS). The additional coating may be applied to the core/shell QDs by micro emulsion synthesis, which allows large-scale batch encapsulation of the QDs.

Subsequently, the core/shell QDs may be dispersed in a polymer matrix and fabricated as polymer nanofibers and polymer/QD-MAT materials by electrospinning. By using the electrospinning method, the monodispersed quantum dots can be directly and uniformly distributed in the fiber matrix and luminescence quenching can be reduced, compared with the conventional phosphor layer with QDs-embedded thin film structure. The polymer shell can provide extra protection to the QDs against oxidation. In addition, fluorescence emission color can be easily tunable by controlling the size of QDs and the composition of the layers in the QD-MAT.

Suitable polymer for dispersion of QDs may include but not limited to nylon 6,6, polyurethanes (PU), polybenzimidazole (PBI), polycarbonate (PC), polyacrylonitrile (PAN), poly(methyl methacrylate) (PMMA), polyaniline (PANI), polystyrene (PS), polyethylene terephthalate (PET), poly(vinylidene fluoride) (PVDF), polyvinyl fluoride (PVF), polyvinylchloride (PVC), poly(9-vinylcarbazole) (PVK) and polyvinylacetate (PVAc).

In some embodiments, the core/shell QDs may be dispersed in a polymer matrix at about 25-50° C. and mixed at a stirring speed of about 50-250 rpm to obtain a QD-polymer composite with a concentration of about 0.1-5 wt % of QDs, preferably about 0.1-2 wt %, and more preferably about 0.1-1 wt %. The polymer matrix may contain solvents. Suitable solvents include but not limited to toluene, N,N-dimethylforamide, acetone, chloroform and dichloromethane. In some embodiments, the solvents may include N,N-dimethylforamide and acetone in a ratio ranging about 7:3-5:5, preferably about 7:3-6:4, and more preferably about 7:3. In some preferred embodiments, the dispersion of QDs into the polymer matrix is carried out under nitrogen to prevent oxidation.

Figure 4:
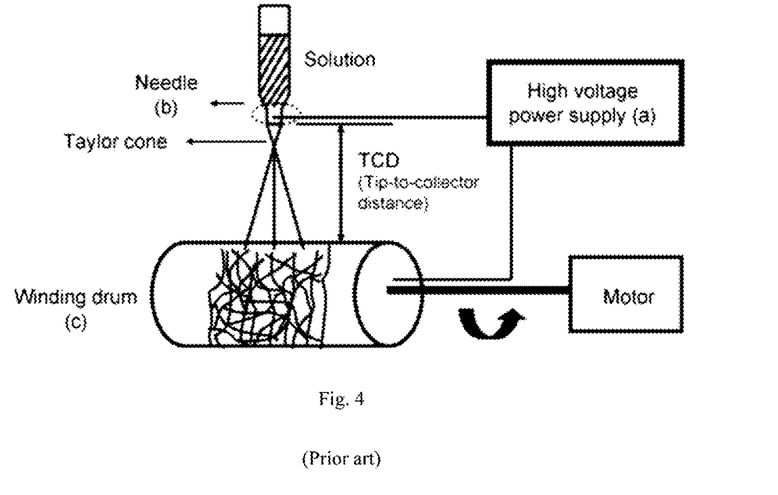
FIG. 4 is a schematic illustration of the basic set up for electrospinning.

Conventional electrospinning system as shown in FIG. 4 may be used for electrospinning the QD-nanofibers. The electrospinning system may include a high voltage power supply (a), a metallic needle (b) and a collector (c). The QD-polymer composite for electrospinning may be loaded into a plastic syringe of the electrospinning system. A positive terminal may be connected to the syringe needle tip while a metal foil-covered collector working as a counter electrode. The collector may include a winding drum covered with aluminum foil or a roll-to-roll collector.

Several parameters may be varied in order to obtain the QD-nanofibers with desired diameter and optical properties and control the thickness of the QD-MAT. These parameters include the voltage between the needle tip and collector, the tip-to-collector distance (TCD), the rotating speed of the collector, the concentration and feed rate of the QD-polymer solution. In some embodiments, the voltage between the needle tip and collector may be about 10-50 kV. In some embodiments, the TCD may be about 10-50 mm. In some embodiments, the concentration of the QD-polymer solution may be about 10-25 wt %. In some embodiments, the feed rate of the QD-polymer solution may be about 1-10 ml/h. In some embodiments, the rotating speed of the collector may be about 200-300 rpm. In some embodiments, the non-woven QD-nanofibers may have a diameter ranging from about 0.1 μm to 5 μm. In some embodiments, the thickness of the QD-MATs may have a thickness ranging from about 10-100 μm.

The method of continuous flow synthesis of QD-MATs may be carried out in a flow reactor.

The flow reactor may include two core precursor chambers containing the first and second core precursors, a first furnace, two shell precursor chambers containing the first and second shell precursors and a second furnace. With the use of the flow reactor, large amounts of core/shell QDs may be obtained, with colors ranging from bluish green to red, which are suitable for use as color-conversion materials in white LEDs.

In the whole reaction system, both the flow rate and the reaction temperature can be controlled. The synthetic process will go continuously as the reaction is mainly controlled by purging pump to control the chemicals flow-in and products flow-out process. In some embodiments, the flow rate may be in the range of about 2.9 ml/min to 15 ml/min.

In another aspect, the present application provides a method of correcting emission spectrum of light emitting devices with the abovementioned QD-MATs in order to achieve a wider color gamut and improved CRI (Color Rendering Index). Red- and green-emitting QD-MATs may be prepared by the above method. A single layer or multiple layers of QD-MATs may be laminated on the light emitting devices. The multiple layers of QD-MATs may have the same or different sizes of QDs.

For LED displays, the QD-MATs may be directly laminated on either of the diffuser or the brightness enhancement film to make color more vivid and saturated. For LED lightings (e.g. illumination, grow light, etc.), the QD-MATs may be laminated on the surface of the encapsulant as a remote phosphor to realize a higher CRI.

In some embodiments of the present application, Cd-free luminescent QD-MATs with high quantum yield (about 50-70%, which is comparable with Cd-containing quantum dots) InP/ZnS/SiO$_2$ or InP/ZnS/TiO$_2$ core/shell QDs and Cu (Mn) doped ZnSe/SiO$_2$ core/shell QDs with different sizes may be used.

In some embodiments of the present application, multi-layered QD-MATs converter with various sizes of QDs may be laminated on near UV or blue LED chip. By exploiting the broad color tunability of QDs by varying their sizes, rainbow color lights from the laminated LED chip can be blended to emit a perfect white light with tunable spectrum and excellent CRI. The exact emitting spectrum of such a LED device can be finely tuned by the thickness or concentration of each layer thus a "Tailored-light" LED will be achieved.

Example 1—Synthesis of CdSe/ZnS Core/Shell QDs 260 mg cadmium oxide (CdO), 12 ml oleic acid and 10 ml 1-octadecene (ODE) were mixed and kept at around 200° C. in a core precursor chamber. In the other core precursor chamber, 120 mg selenium (Se), 0.8 ml trioctylphosphine (TOP) and 5 ml 1-octadecene (ODE) were mixed and stirred at room temperature until a clear solution was obtained.

5.8 ml of Se solution (flow rate of 2.9 ml/min) and 12 ml of CdO solution (flow rate of 12 ml/min) in the core precursor chambers were pumped into a first furnace to carry out the synthetic reaction and the temperature of the furnace was kept at around 180° C. with reaction time of about 30-35 seconds at flow rate of about 15 ml/min CdSe quantum dot cores with an average particle size of <2 nm and green emission at 470-530 nm were obtained.

5.8 ml of Se solution (flow rate of 2.9 ml/min) and 12 ml of CdO solution (flow rate of 12 ml/min) in the core precursor chambers were pumped into a first furnace to carry out the synthetic reaction and the temperature of the furnace was kept at around 250° C. with reaction time of about 15 minutes at flow rate about 15 ml/min CdSe quantum dot cores with an average particle size of 4-5 nm and red emission at 600-700 nm were obtained.

In one of the shell precursor chamber, 82 mg zinc oxide (ZnO), 2.5 ml oleic acid and 7.5 ml 1-octadecene (ODE) were mixed and heated up to around 220° C. Upon the chemicals were dissolved, the reaction mixture was allowed to keep at around 130° C. 32 mg sulphur (S) in 10 ml 1-octadecene (ODE) was allowed to keep at around 130° C. in the other shell precursor chamber.

After completing the synthetic process of CdSe cores, the reaction mixture was allowed to pump into a second furnace and kept at around 180° C. At this stage, 0.4 ml of Zn solution was injected into the second furnace and reacted with CdSe core at around 180° C. for about 3 minutes. Then, 0.4 ml of S solution was injected into the reaction mixture for about 30 seconds and the reaction mixture was kept at around 200° C. for about 6 minutes. The first layer of ZnS shell was formed on the CdSe cores. The second layer of ZnS shell was formed by pumping 0.6 ml of Zn solution and 0.6 ml S solution into the second furnace and heated at around 200° C. for about 8 minutes.

After the reaction, the mixture was allowed to cool down to around 60° C. and ethanol was added to the reaction mixture for purification process. The core/shell QDs were isolated by centrifugation at around 5000-6000 rpm.

A layer of silicon dioxide shell was added onto the surface of core/shell QDs by injecting TEOS into the reaction product for further encapsulating process. The QDs were re-dispersed into a 5 ml mixture of 10:1:0.1 ethanol, water and concentrated ammonia solution (25%) under stirring to form a uniform dispersion. A mixture of TEOS and ethanol was added dropwise to the dispersion and stirred at room temperature for 12 h to finish the reaction. A layer of SiO$_2$ with thickness of 12 nm was applied on top of QD surface.

Example 2—Fabrication of QD Nanofibers and QD-MAT by Electrospinning

The core/shell QDs were first dispersed into a polymer matrix before electrospinning. To a 250 ml round bottom flask, dimethylformamide (DMF) and acetone solvent were mixed in 7:3 ratio and the resulting mixture was stirred for 5-10 minutes. 16.5 wt % of PVDF powder was added to the resulting mixture and kept at 65° C. After reflux for 5 hours, the resulting mixture was allowed to cool down to room temperature and a polymer composite was obtained.

Figure 5A:
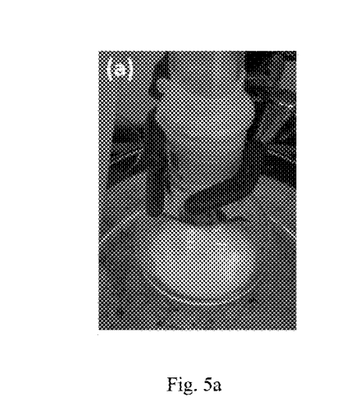
FIG. 5a shows a QD-polymer composite obtained from Example 2 under excitation at 420 nm
Figure 5B:
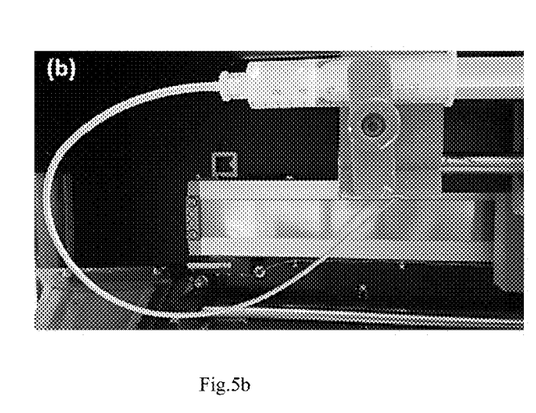
FIG. 5b shows QD-polymer composite from Example 2 loaded into a plastic syringe.

To a 250 ml round bottom flask, the core/shell QDs from Example 1 were added to the above PVDF polymer composite until the concentration of QD reached 0.1-5 wt %. The solution was allowed to stir at room temperature under nitrogen for about 30-60 minutes until the QDs were well-dispersed into the polymer composite. FIG. 5a shows the obtained QD-polymer composite under 420 nm excitation. The QD-polymer composite was loaded into a plastic syringe as shown in FIG. 5b for electrospinning process. The parameters of the electrospinning process are provided in table 1 below:

TABLE 1

| Electric field/kV | 30 |
| Feed rate/ml h$^{-1}$ | 6.5-8.0 |
| Temperature/° C. | 25-28 |
| Humidity/% | <50 |
| Size of QDs/nm | 2-5 |
| TCD/mm | 45 |
| Rotating speed of winding drum/rpm | 250 |

Figure 6:
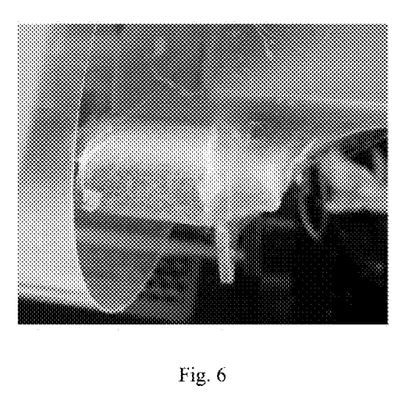
FIG. 6 shows the nanofibers obtained from Example 2 with green emission when under excitation at 420 nm.
Figure 7A:
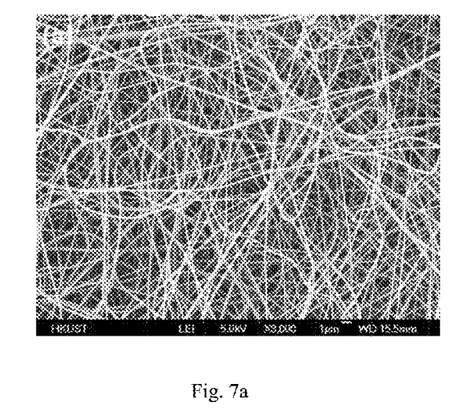
FIGS. 7a and 7b respectively show a SEM image of QD-MAT and TEM image of the synthesized QDs in example 2.
Figure 7B:
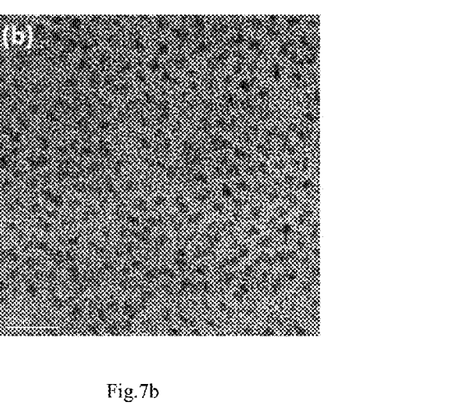

FIG. 6 shows the nanofibers obtained with green emission when under excitation at 420 nm. The QD-MAT obtained was allowed to be encapsulated by water barrier film having water vapor transmission rate (WVTR) of $10^{-2}$ to $10^{-3}$ g/m$^2$/day with adhesive tape sealing on 4 edges. FIGS. 7a and 7b respectively show a SEM image of QD-MAT and TEM image of the synthesized QDs. From the SEM image, the nanofibers were uniformly dispersed with the fiber diameters ranging from 100-200 nm, respectively with non-woven packed. The porosity of the as stated nanofiber MAT is 85.9%. From the TEM image, the QDs were well dispersed with the size of 2 nm, no aggregation was found in the QD dispersion.

Example 3—Fabrication of Free Standing QD-MAT

Core/shell QDs from example 1 was loaded to an electrospun polymer by the following steps:
A polymer mat was prepared according to Example 2, except that QDs were not added when preparing the polymer matrix.
To a 10 ml of sample vial, 10 mg of green emissive QDs and 1 mg of red emissive QDs from Example 1 were separately dispersed in 1 ml of chloroform. The sample vial was capped and sealed by parafilm and sonicated for 10-20 minutes, until the QDs were evenly distributed.
The QD solution was loaded to the polymer mat using a dropper. The QD-MAT was allowed to be air dried for 5 minutes and then encapsulated by water barrier film having WVTR of $10^{-2}$ to $10^{-3}$ g/m$^2$/day with adhesive tape sealing on 4 edges.

Figure 8A:
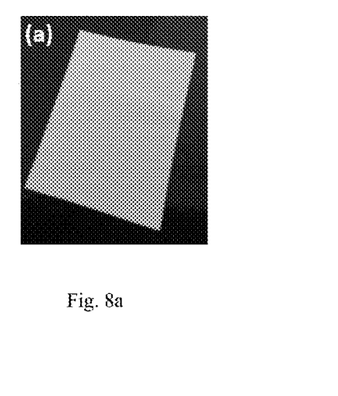
FIGS. 8a and 8b respectively show a QD-MAT obtained from Example 3 and the QD-MAT when excited at 420 nm.
Figure 8B:
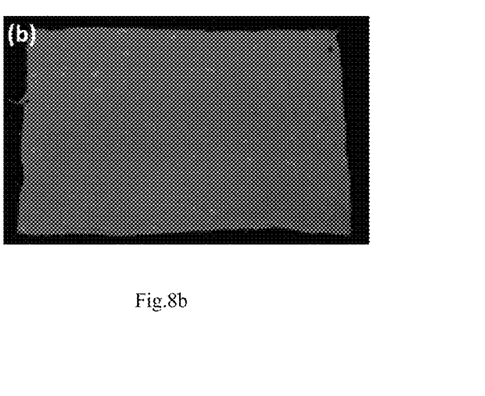

FIGS. 8a and 8b respectively show the QD-MAT obtained and the QD-MAT when excited at 420 nm.

Figure 9:
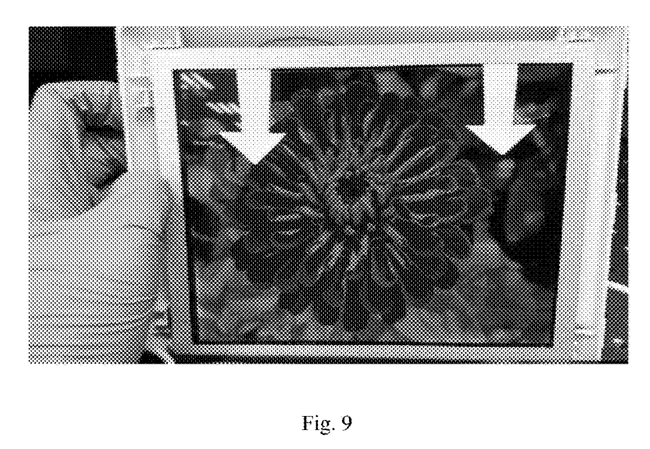
FIG. 9 shows a QD-MAT obtained from Example 3 being put on a LED display.

FIG. 9 shows the QD-MAT obtained being put on a LED display. The as prepared QD-MAT was put in between the light guide plate and LCD layer of the LED display. Since nanofiber has a light diffusing effect, the diffuser layer can be directly removed and replaced by QD-MAT. The background light of the LED display can be either driven by white light LED or by blue light LED (430-450 nm). Upon excitation by the LED light source, the QD-MAT will emit green and red emission, contributing RGB color which is the key element of a display. The display made by the QD-MAT obtained in this example achieved a NTSC of 99.7%.

Example 4—Fabrication of QD-MAT on PET Film

Figure 10:
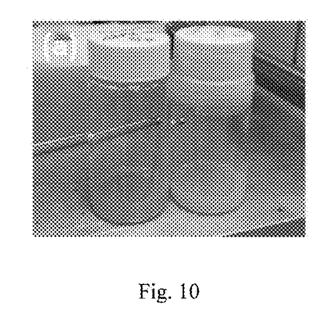
FIG. 10 shows QD-based adhesive materials obtained from Example 4.
Figure 11A:
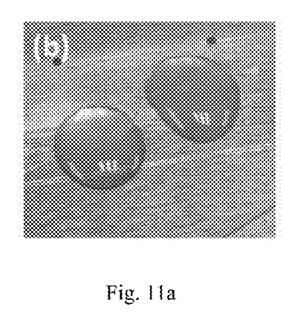
FIGS. 11a and 11b respectively show the QD-based adhesive materials of FIG. 10 on a glass slide and when excited at 420 nm.
Figure 11B:
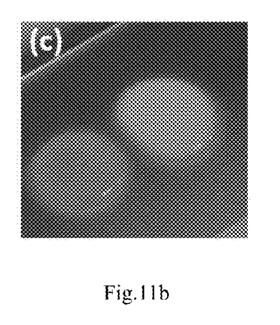

To a 2 g heat cure silicone adhesive, 10 mg of green emissive QDs and 1 mg of red emissive QDs from Example 1 was added separately and mixed well by a planetary centrifugal mixer (THINKY Mixer) at 300-500 rpm and 25-30° C. for 1-3 minutes. FIG. 10 shows the QD-based adhesive material obtained. FIGS. 11a and 11b respectively show the QD-based adhesive materials on a glass slide and when excited at 420 nm.

Similar to Example 2, the resulting QD composite was electrospun as nanofibers. The nanofibers were then coated on PET film by using doctor blade technique (blade moving speed: 2-5 mm/s) at room temperature and atmospheric condition under nitrogen.

The QD-nanofiber coated film was allowed to heat cure at 80° C. for 15 minutes. The QD-MAT was allowed to be encapsulated by water barrier film having WVTR of $10^{-2}$ to $10^{-3}$ g/m$^2$/day with adhesive tape sealing on 4 edges.

Figure 12:
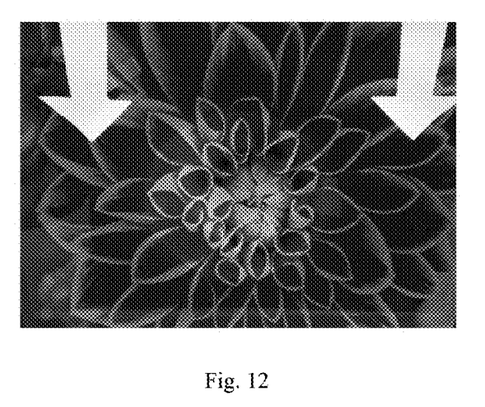
FIG. 12 shows a QD-MAT obtained from Example 4 being put on a LED display.

FIG. 12 shows the QD-MAT obtained being put on a LED display. The performance of the QD-MAT is comparable to that of in Example 3.

Example 5—Fabrication of a Double-Layer QD-MAT

Figure 13:
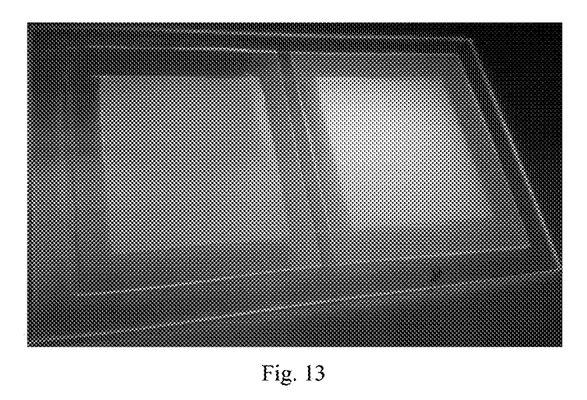
FIG. 13 shows on the left the single layer of QD layer and on the right the double QD layer obtained from Example 5.

Similar to example 4, a first layer of QD film was prepared and allowed to heat cure at 80° C. for 15 minutes. A second layer of QD-based adhesive material was coated on top of the first cured QD layer and was allowed to heat cure at 80° C. for 15 minutes. As a comparison, FIG. 13 shows on the left the single layer of green QD layer and on the right the double QD layer obtained above. It can be seen that, when excited at 420 nm, the single and double QD layers show different colors.

The QD-MAT was allowed to be encapsulated by water barrier film having WVTR of $10^{-2}$ to $10^{-3}$ g/m$^2$/day with adhesive tape sealing on 4 edges.

The QD-MAT was put on a diffuser layer for performance testing. Since this design does not have nanofiber integrated into the system, the QD-MAT was located in between the light guide plate and diffuser layer, by which the LCD is put on top of diffuser. By using this design, the NTSC achieved 103%.

Example 6—Performance Test of QD-MATs

The performance of the QD-MATs from Examples 3 and 5 were characterized by using a LED display. A purchased LED HD 8 inches display with resolution 1024*768 and displays modified with QD-MATs from Examples 3 and 5 were tested under the same experimental condition.

The QD-MAT from Example 3 was placed in between the light guide plate and LCD layer while the diffuser was omitted owing to the fact that nanofibers share the same function as diffuser layer in LED display.

The QD-MAT from Example 5 did not have any nanofibers layer, and thus it was placed in between the light guide plate and diffuser layer, while the LCD layer was placed on top of the diffuser.

Figure 14:
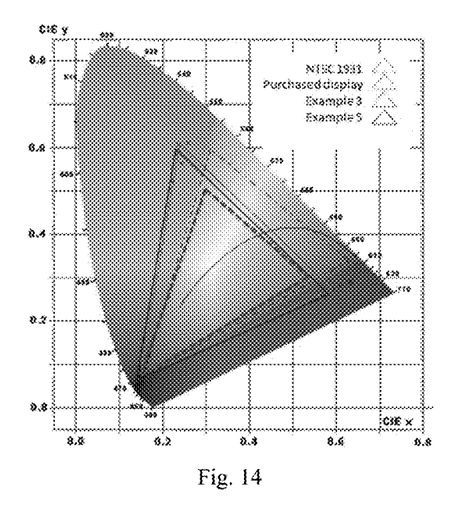
FIG. 14 shows the color gamut result of Examples 3 and 5.

The results are illustrated in FIG. 14 and table 2.

TABLE 2

|  | Color gamut/% (CIE) | Thickness/mm |
|---|---|---|
| NTSC 1931 | 100 | N/A |
| Purchased display | 72.02 | N/A |
| Example 3 | 99.7 | 0.06 |
| Example 5 | 103 | 0.466 |

It was found that the color gamut of the purchased display is 72.02% while QD-MAT from Examples 3 and 5 assisted LED display showing a color gamut of 99.7% and 103%, respectively, which is at least 27.7% improvement as compared to the purchased display. The result indicated that the QD-MATs prepared according to the present application can enhance the entire range of colors available on a particular device such as a TVs, cell phones, tablets or any other displays.

Figure 15:
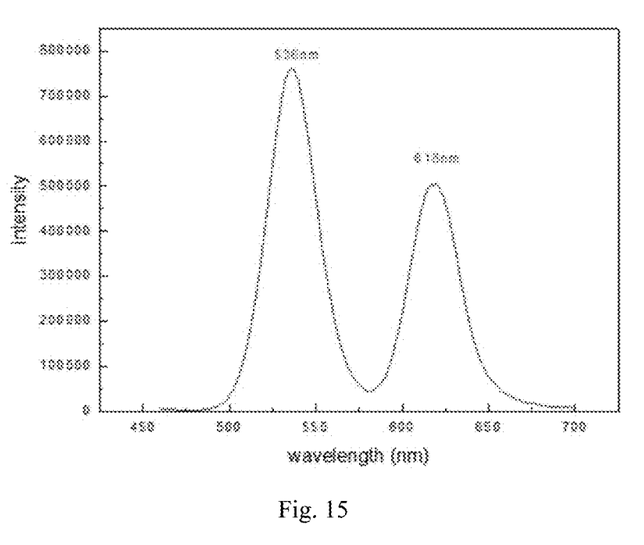
FIG. 15 is the emission spectrum of the QD-MATs from Examples 3 and 5 upon 420 nm excitation.

Upon photoexcitation at 420 nm, the QD-MATs from Examples 3 and 5 emitted at 536 nm and 618 nm, respectively. The emission spectrum is shown in FIG. 15. The emission intensity at 536 nm (from green emissive QDs) was found to be higher than that at 618 nm (from red emissive QDs) and the FWHM was within the range of 30-45 nm, which met the requirement for the best display efficiency.

Thus, specific methods for continuous flow synthesis of core/shell quantum dots doped polymer mats and methods for correcting emission spectrum of a light emitting device have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "includes", "including", "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of continuous flow synthesis of core/shell quantum dots doped polymer mats (QD-MAT), comprising:
    mixing a first core precursor with a second core precursor and feeding the reaction mixture into a first furnace to obtain quantum dot cores;
    feeding a first shell precursor and a second shell precursor into a second furnace and simultaneously injecting the quantum dot cores to obtain core/shell quantum dots;
    mixing the core/shell quantum dots with a polymer solution to obtain a QD-polymer composite; and
    introducing the QD-polymer composite to an electrospinning system comprising a high voltage power supply, a metallic needle and a collector to obtain quantum dot nanofibers (QD-nanofibers) and thereby fabricating the core/shell quantum dots doped polymer mats, wherein the QD-nanofibers with desired diameter and optical properties and the QD-MAT with controlled thickness are obtained by varying multiple parameters, and wherein the parameters comprise a voltage of about 10-50 kV between the needle tip and the collector, a tip-to-collector distance (TCD) of about 10-50 mm, a concentration of the QD-polymer solution of about 10-25 weight %, a feed rate of the QD-polymer solution of about 1-10 ml/hour, the QD-nanofibers with a diameter ranging from about 0.1 μm to 5 μm and a thickness of the QD-MATs ranging from about 10-100 μm.

2. The method of claim 1, wherein the temperature of the first furnace is maintained with a temperature deviation no more than about 3° C.

3. The method of claim 1, wherein the core/shell quantum dots have a double layer or triple layer core/shell structure.

4. The method of claim 1, wherein the first and second core precursors and the first and second shell precursors comprise at least one element selected from the group consisting of In, P, Zn, S, Se, N, Ga, Si, Ti, Ce, La, V, O and Cd.

5. The method of claim 4, wherein the core/shell quantum dots have a core/shell structure selected from the group consisting of InP/ZnS, InP/ZnSe, InN/GaN, InP/ZnS/SiO$_2$, InP/ZnS/InZnS, GaP/ZnS/SiO$_2$, GaP/ZnS/GaZnS, InN/GaN/SiO$_2$ and CdSe/ZnS.

6. The method of claim 1, wherein the size distribution of the core/shell quantum dots has a standard deviation of about 10% or less.

7. The method of claim 1, further comprising forming an additional coating around the core/shell QDs.

8. The method of claim 7, wherein the additional coating comprises a compound having an affinity for the polymer solution.

9. The method of claim 7, wherein the additional coating comprises at least one selected from the group consisting of silicon dioxide, zirconium oxide, titanium dioxide and other inorganic oxides having an affinity for the polymer solution, wherein a precursor of the additional coating is at least one of tetraethyl orthosilicate (TEOS) and/or tetramethoxysilane (TMOS).

10. The method of claim 7, wherein the additional coating is formed by micro emulsion synthesis.

11. The method of claim 1, wherein the polymer solution comprises at least one polymer selected from the group consisting of nylon 6.6, polyurethanes (PU), polybenzimidazole (PBI), polycarbonate (PC), polyacrylonitrile (PAN), poly(methyl methacrylate) (PMMA), polyaniline (PANI), polystyrene (PS), polyethylene terephthalate (PET), poly(vinylidene fluoride) (PVDF), polyvinyl fluoride (PVF), polyvinylchloride (PVC), poly(9-vinylcarbazole) (PVK) and polyvinylacetate (PVAc).

12. The method of claim 1, wherein the core/shell QDs are dispersed in a polymer solution at about 25-50° C. to obtain a QD-polymer composite with a concentration of about 0.1-5 wt % of QD.

13. The method of claim 12, wherein the QD-polymer composite contains at least one solvent selected from the group consisting of toluene, N,N-dimethylforamide, acetone, chloroform and dichloromethane.

14. The method of claim 1, wherein the method is carried out in a flow reactor with a flow rate in the range of 2.9 ml/min to 15 ml/min.

15. A method of correcting emission spectrum of a light emitting device, comprising:
    mixing a first core precursor with a second core precursor and feeding the reaction mixture into a first furnace to obtain quantum dot cores;
    feeding a first shell precursor and a second shell precursor into a second furnace and simultaneously injecting the quantum dot cores to obtain core/shell quantum dots;
    mixing the core/shell quantum dots with a polymer solution to obtain a QD-polymer composite;

introducing the QD-polymer composite to an electrospinning system comprising a high voltage power supply, a metallic needle and a collector to obtain quantum dot nanofibers (QD-nanofibers) and thereby fabricating the core/shell quantum dots doped polymer mats, wherein the QD-nanofibers with desired diameter and optical properties and the QD-MAT with controlled thickness are obtained by varying multiple parameters, and wherein the parameters comprise a voltage of about 10-50 kV between the needle tip and the collector, a tip-to-collector distance (TCD) of about 10-50 mm, a concentration of the QD-polymer solution of about 10-25 weight %, a feed rate of the QD-polymer solution of about 1-10 ml/hour, the QD-nanofibers with a diameter ranging from about 0.1 µm to 5 µm and a thickness of the QD-MATs ranging from about 10-100 µm; and laminating at least one layer of the QD-MATs prepared on the light emitting device.

16. The method of claim 15, wherein the at least one layer of QD-MATs comprises QDs with same or different sizes.

17. The method of claim 15, wherein the at least one layer of QD-MATs is directly laminated on either of a diffuser or a brightness enhancement film of an LED display of the light emitting device.

18. The method of claim 15, wherein the at least one layer of QD-MATs is laminated on the surface of the encapsulant of an LED lighting of the light emitting device as a remote phosphor.

19. The method of claim 15, wherein the at least one layer of QD-MATs is doped with $InP/ZnS/SiO_2$ or $InP/ZnS/TiO_2$ core/shell QDs and Cu (Mn) doped $ZnSe/SiO_2$ core/shell QDs of different sizes.

* * * * *